United States Patent
Andreev et al.

(10) Patent No.: US 6,526,553 B1
(45) Date of Patent: Feb. 25, 2003

(54) CHIP CORE SIZE ESTIMATION

(75) Inventors: Alexander E. Andreev, San Jose, CA (US); Ranko Scepanovic, San Jose, CA (US); Ivan Pavisic, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/837,492

(22) Filed: Apr. 18, 2001

(51) Int. Cl.[7] .................................................. G06E 9/45
(52) U.S. Cl. ............................................. 716/8; 716/10
(58) Field of Search ............................. 716/8, 7, 10, 2; 357/45; 364/691

(56) References Cited

U.S. PATENT DOCUMENTS 4,295,149 A * 10/1981 Balyoz et al. ................ 357/45
5,557,533 A * 9/1996 Koford et al. ................ 364/491
5,563,801 A * 10/1996 Lee et al. ..................... 364/491
6,249,902 B1 * 6/2001 Igusa et al. .................... 716/10
6,301,693 B1 * 10/2001 Naylor et al. .................. 716/10
6,327,494 B1 * 12/2001 Kanazawa ...................... 716/7

* cited by examiner

*Primary Examiner*—David Nelms
*Assistant Examiner*—Thinh T. Nguyen
(74) *Attorney, Agent, or Firm*—Westman, Champlin & Kelly

(57) ABSTRACT

A minimum core size of an integrated circuit chip is estimated for given parameters of an existing technology. The average wire length for the nets is calculated, and the centers of each cell are assigned to x,y coordinates to minimize wire length. The widths of routing channels between consecutive columns, and their associated core sizes are estimated based on the cell placement and the existing technology parameters. The minimum core size is identified from the estimated core sizes.

20 Claims, 2 Drawing Sheets

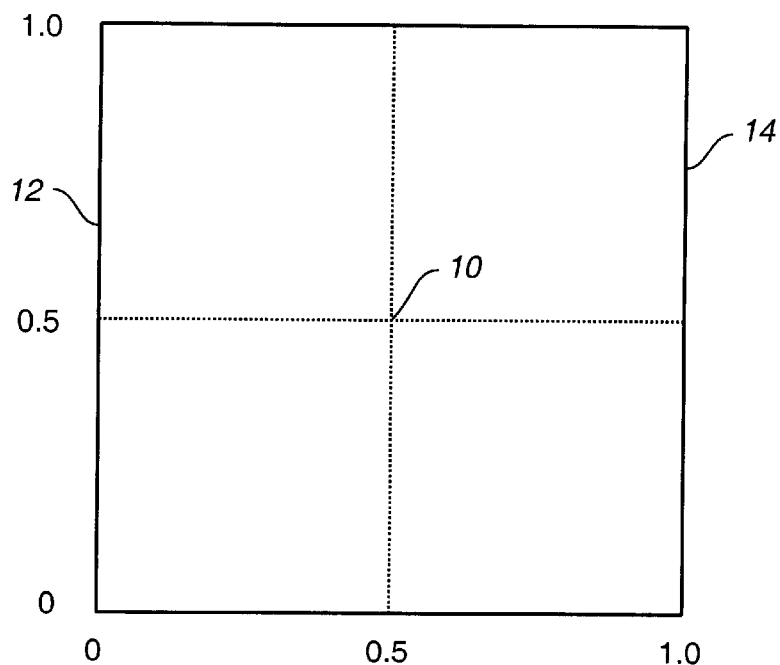
FIG._1
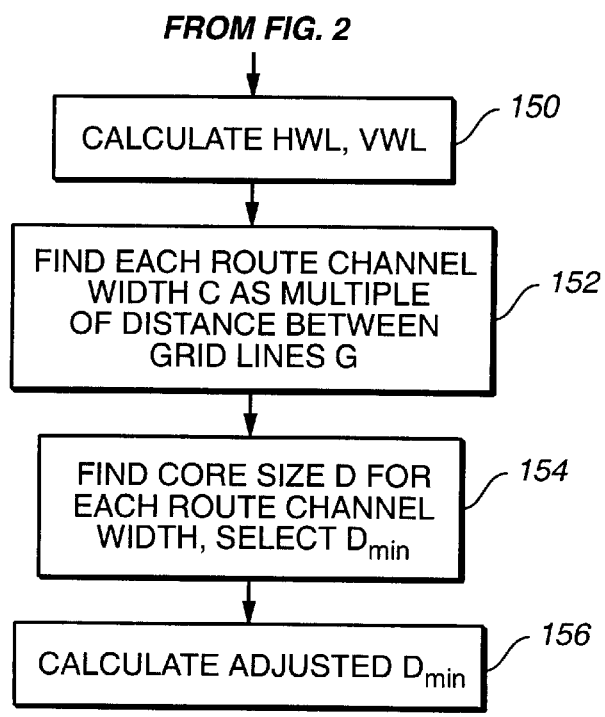
FIG._3

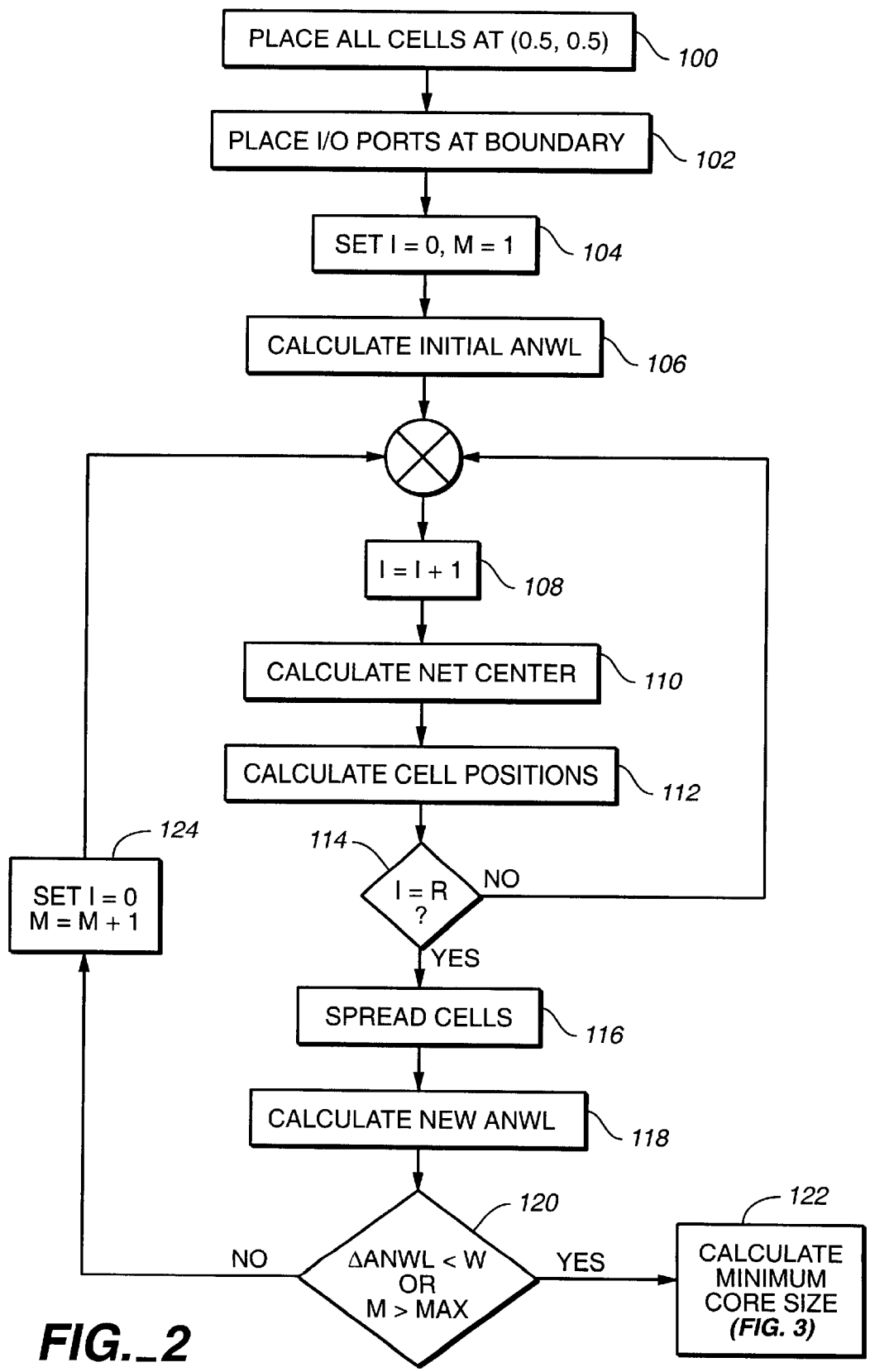
FIG._2

US 6,526,553 B1

CHIP CORE SIZE ESTIMATION

FIELD OF THE INVENTION

This invention relates to estimation of the minimal chip core size, which is useful in designing integrated circuit (IC) chips to successfully place cells and route wires defined by a given gate level netlist in a given technology library.

BACKGROUND OF THE INVENTION

In order to successfully layout cells and route conductive paths (wires) in an integrated circuit chip, it is important to estimate the approximate size of the chip core. Presently, chip size is estimated on the skill and experience of the IC chip designer. Persons with less skill often need to calculate the approximate size of the chip, a process that is quite laborious. Errors in chip size estimates can affect the placement and routing of conductive wires in the chip, requiring redesign of the entire chip. There is, accordingly, a need for an automated process for accurately estimating the chip core size for purposes of placement and layout.

SUMMARY OF THE INVENTION

A minimum core size of an integrated circuit chip is estimated based on parameters of the technology used for placing cells and routing conductive paths on the chip, and the chip netlist. An average wire length is calculated for the nets of the netlist based on the perimeter of the net and of the core. The center of each cell is assigned x,y coordinates to minimize the average wire length. The widths of routing channels between consecutive columns and associated core sizes are estimated based on the estimated cell placement and the technology parameters. The estimated minimum core size is identified.

The average wire length is calculated from the average size of the half-perimeters of the nets, and dividing that average by the half-perimeter of the core.

The cell placement is performed by assigning the center of each cell to initial x,y coordinates. The center of each net is calculated, and new coordinates are calculated for each cell center based on the prior x,y coordinates for that cell, as well as the x,y coordinates of the centers of each net connected to the cell and the numbers of pins of those nets. The cells are then spread over the x and y extents of the net. The cell placement steps are preferably repeated through plural iterations.

In preferred embodiments, the estimated minimum core size is adjusted for the area required for clock buffers and megacells.

Another aspect of the present invention is the provision of computer readable program that is embedded in a computer usable medium. The computer readable program includes program code that causes a computer to estimate a minimum core size and carry out the process of the invention.

BRIEF DESCRIPTION OF THE DRAWINGS

FIG. 1 illustrates an initial layout of a chip in accordance with the presently preferred embodiment of the present invention.

FIG. 2 is a flow chart of a process for cell placement in a chip in accordance with the present invention.

FIG. 3 is a flow chart of a chip core size and channel width calculation technique for identifying the minimum core size for the integrated circuit chip.

DETAILED DESCRIPTION OF THE PREFERRED EMBODIMENTS

In accordance with the present invention, the post-placement wire length for an IC chip is estimated on the basis of a rapid force-directed cell placement estimation technique. The optimal core size and optimal number of cell columns are calculated based on the wire length prediction and process parameters.

FIG. 1 illustrates a square 14 defining x and y axes of a core extending between x=0 and x=1 and between y=0 and y=1. In accordance with the present invention, each cell 10 is initially positioned so that a center point, or center of gravity, of the cell is at coordinate 0.5, 0.5. Input-output (I/O) ports 12 are also treated as cells but are placed along the boundary of the square. All of the I/O port placements may be constrained to a specific side of the chip, or may be distributed on two or more sides. Additionally, the relative positions of the I/O ports may be specified to each side. Thus, I/O ports 12 are placed at coordinates such that either the x or y coordinate is either 0.0 or 1.0, and the other coordinate is [0, 1]

The process commences in FIG. 2 at step 100 where the cells are placed at the 0.5, 0.5 coordinates of the square illustrated in FIG. 1. The I/O ports are positioned at the boundary at step 102. At step 104, I and M parameters are set to 0 and 1 respectively to permit the process to iterate in a manner to be described.

At step 106, an initial average normalized wire length (ANWL) is calculated. More particularly, the length of each net is first calculated as a half perimeter of the bounding box of all of the pins (cells) on that net. The average of all net lengths is calculated, and the ANWL is calculated as the average net length divided by one half the core perimeter defined by square 14.

At step 108, I is incremented by one. At step 110, the center of the net is calculated as the center of gravity of all pins of the net.

At step 112, new cell positions are calculated. For purposes of calculating the new position of each cell C, $(x_o, y_o)$ are the current center coordinates of cell C, $(x_1, y_1), (x_2, y_2),$ ..., $(x_K, y_K)$ are the centers of nets $N_1, N_2, \ldots, N_K$ connected to cell C, and $p_1, p_2, \ldots, p_K$ are the numbers of pins in each of those nets. The new coordinates $(x_n, y_n)$ for the center of cell C are calculated as:

$$x_n = x_o + \lambda \cdot \frac{\frac{1}{p_1}(x_1 - x_o) + \ldots + \frac{1}{p_k} \cdot (x_k - x_o)}{\frac{1}{p_1} + \ldots + \frac{1}{p_k}}, \text{ and}$$

$$y_n = y_o + \lambda \cdot \frac{\frac{1}{p_1}(y_1 - y_o) + \ldots + \frac{1}{p_k} \cdot (y_k - y_o)}{\frac{1}{p_1} + \ldots + \frac{1}{p_k}},$$

where $\lambda$ is a parameter for process convergence. Typically, $\lambda$ will have a value of about 0.8.

A similar procedure is formed for the I/O ports, except they are allowed to move only along the core boundary (x=0 or 1 or y=0 or 1).

At step 114, a determination is made as to whether I has been incremented to a predetermined number R. If it has not, the process loops -back to step 108 and repeats steps 108–112 until I=R. For example, if R=5, the process iterates through five loops of repositioning the cells. As a result of the process through step 112, new coordinates for the center of each cell are calculate to effectively "move" each cell from the center coordinates (0.5, 0.5) to new coordinates in an optimal arrangement.

The force-directed movement of the cells tends to "cluster" the cells to the middle of the core. Consequently, at step 116 the cell positions are spread. Cell position spreading at step 116 is simply the spreading the cells uniformly across square 14, first along one axis, such as the x axis, and then along the other axis, such as the y axis. Based on the new cell positions, a new average normalized wire length (AMWL) is calculated for the chip at step 118 using the same process described in connection with step 106.

At step 120, a determination is made as to whether the process should repeat through steps 108–118 or end. More particularly, either (or both) of two tests may be performed at step 120. In a first test, the newly calculated AMWL is compared to the AMWL value used at step 110 during the prior iteration. If the average normalized wire length has not changed by more than some minimal amount W, that is if the change of average normalized wire length is substantially unchanged from the prior iteration, the process continues to step 122 to calculate the minimum core size, as described in connection with FIG. 3. If AMWL has changed more than a predetermined amount, such as more than about 1%, I is reset to 0 at step 124 and the process returns to step 104 where it iterates through R more cycles of steps 108–112. The cells are spread at step 116 and a new AMWL is calculated at step 118.

Alternatively, or in addition, some maximum number of iterations of the process may be established through a predetermined number for M. For example, if the maximum value, Max, of M is 20, indicating that the process iterated 100 times through the cell position recalculations and 20 times through the spreading of cells, the process may, nevertheless, continue onto the calculation of the minimum core size at step 122. In this case if M≦Max, the process iterates through step 124 where M is incremented by 1 and I reset to zero.

At the completion of the rapid force-directed placement procedure illustrated in FIG. 2, the minimum core size calculation process of FIG. 3 is performed.

At step 150, the average normalized wire length (ANWL) is calculated for each of the horizontal and vertical directions as HWL and BWL. More particularly, the average horizontal size of all boxes is found and divided by the horizontal length of the core to identify the horizontal average normalized wire length (HWL). The vertical average normalized wire length (VWL) is calculated in the same manner, except that the vertical sizes (heights) of the boxes and core are employed.

At step 152, a core size D for each route channel width C is identified. More particularly, various parameters of the system can be expressed in equations using the route channel width C and core size D. The number of columns, NC, in the integrated circuit is expressed as $$NC = \frac{D}{W+C},$$

where W is the width of all standard cells and columns. The horizontal routing capacity, $H_{CAP}$, is $$H_{CAP} = HL \cdot \frac{D^2}{G} - P,$$

where HL is the number of horizontal routing layers in the chip available for signal routing and P is the total number of pins on all standard cells. The vertical routing capacity, $V_{CAP}$, is $$V_{CAP} = \frac{D^2}{G} \cdot \frac{(VL-1) \cdot W + VL \cdot C}{W+C},$$

where VL is the number of vertical paths between layers in the chip available for signal routing.

The maximum column utilization, $PU_{max}$, maximum horizontal routing utilization, $HRU_{max}$, and maximum vertical routing utilization, $VRU_{max}$, for the chip are parameters based on the routing technology, and particularly the cell placement tool used to place cells in the chip. Consequently, these are parameters dictated by the routing technology. Nevertheless, it is important that the chip under design not exceed these maximums. The actual column utilization, PU, actual horizontal routing utilization, HRU, and actual vertical routing utilization, VRU, can be estimated based on the following equations:

$$PU = \frac{H}{D \cdot NC} = \frac{H \cdot (W+C)}{D^2},$$

$$HRU = \frac{N \cdot VWL \cdot D}{V_{CAP}} = \frac{G \cdot N \cdot HWL \cdot D}{HL \cdot D^2 - P \cdot G}, \text{ and}$$

$$VRU = \frac{N \cdot VWL \cdot D}{V_{CAP}} = \frac{N \cdot VWL \cdot G \cdot (W+C)}{D \cdot ((VL-1) \cdot W + VL \cdot C)},$$

where H is the total height of all standard cells and N is the number of nets in the netlist.

Possible widths, C, of the routing channels are found as a multiple of G, where C≧0 and $PU \leq PU_{max}$, $HRU \leq HRU_{max}$, and $VRU \leq VRU_{max}$.

At step 154, a value of D is found for each value of C, and a minimum value of D, $D_{min}$, is selected.

At step 156, the minimum value of the core size, $D_{min}$, is adjusted to account for the area required for clock buffers, $A_c$, and the area required for megacells, $A_m$. The area required for clock buffers can be estimated based on the number of flip-flops in the netlist in a manner well known in the art. The megacells are those cells in the netlist having a predetermined area, such as cells that perform memory or hard macro functions. The adjustment for clock buffer and megacell areas can be empirically selected, the following adjustment relationship being quite adequate for most purposes:

$$D_{adj} = \sqrt{D_{min}^2 + A_c + A_m}.$$

The present invention thus provides effective technique for estimating a chip core size used in connection with the design of integrated circuit chips, and particularly, in connection with the layout of cells and routing of conductive paths between cells. The process provides an effective technique with a high degree of accuracy, so that less experienced integrated circuit designers do not need to redesign chips following an inadequate sizing.

The invention is preferably carried out through use of a computer containing a computer program code that causes the computer to calculate an estimate of chip core size based on an input netlist, including the areas of the clock buffers and megacells, and existing or predetermined technology parameters. The computer program code is computer readable and stored within a memory media readable by the computer, such as the hard disc of a computer. Execution of the code by the computer causes the computer to generate the estimated core size based on the input netlist and technology parameters. Consequently, the computer program code is an effective tool usable by integrated circuit designers during the design of integrated circuit chips.

Although the present invention has been described with reference to preferred embodiments, workers skilled in the art will recognize that changes may be made in form and detail without departing from the spirit and scope of the invention.

What is claimed is:

1. A process for estimating a minimum core size for an integrated circuit composed of a plurality of cells to be fabricated using a predetermined technology and defined by nets of a gate level netlist, comprising steps of:

a) identifying utilization parameters of the predetermined technology;

b) calculating an average wire length for each net in the netlist based on the perimeter of an area defined by the net;

c) assigning a center of each cell to x,y coordinates to minimize the average wire length;

d) estimating widths of routing channels between consecutive columns and associated core sizes based on the cell coordinates assigned in step (c) and the utilization parameters identified in step (a); and e) identifying the minimum core size estimated in step (d).

2. The process of claim 1, further including:

(f) adjusting the estimated minimum core size for area required for clock buffers and megacells.

3. The process of claim 2, wherein step (f) is performed by calculating $\sqrt{D_{min}^2 + A_c + A_m}$, where $D_{min}$ is the minimum core size found in step (e), $A_c$ is the area of the core required for clock buffers and $A_m$ is the area of the core required for megacells.

4. The process of claim 1, wherein step (b) is performed by steps of:

b1) identifying an initial half-perimeter of the core, b2) identifying the half-perimeter of the area defined by each net, b3) calculating an average of the half-perimeters identified in step (b2), and b4) dividing the average found in step (b3) by the half-perimeter of the core.

5. The process of claim 4, wherein step (c) is performed by steps of:

c1) assigning a center of each cell to initial coordinates, $x_0, y_0$, c2) calculating the center of each net based on the calculated wire length, c3) calculating new x,y coordinates for each cell center based on the initial $x_0, y_0$ coordinates for the cell and the x,y coordinates and numbers of pins of each net connected to the respective cell, and c4) spreading placement of the cells over the x and y extents of the net.

6. The process of claim 5, further including steps of:

c5) repeating steps (c2) and (c3) a first predetermined number of times, using the new x,y coordinates calculated during the next prior iteration for the initial x,y coordinates, c6) after step (c4), calculating a new wire length for each net based on the placement of the cells, and c7) repeating steps (c5), (c4) and (c6).

7. The process of claim 1, wherein step (c) is performed by steps of:

c1) assigning a center of each cell to initial coordinates, $x_0, y_0$, c2) calculating the center of each net based on the calculated wire length, c3) calculating new x,y coordinates for each cell center based on the initial $x_0, y_0$ coordinates for the cell and the x,y coordinates and numbers of pins of each net connected to the respective cell, and c4) spreading placement of the cells over the x and y extents of the net.

8. The process of claim 7, further including steps of:

c5) repeating steps (c2) and (c3) a first predetermined number of times, using the new x,y coordinates calculated during the next prior iteration for the initial x,y coordinates, c6) after step (c4), calculating a new wire length for each net based on the placement of the cells, and c7) repeating steps (c5), (c4) and (c6).

9. The process of claim 1, wherein step (d) includes steps of:

d1) calculating the average wire length for the nets along the x and y directions, and d2) calculating minimum core sizes based on actual column utilization, x-direction routing utilization and y-direction routing utilization that do not exceed a maximum column utilization parameter, maximum x-direction routing utilization parameter and y-direction routing utilization parameter of the predetermined technology.

10. A computer usable medium having a computer readable program embedded therein for addressing data to cause a computer to estimate a minimum core size of an integrated circuit chip composed of a plurality of cells fabricated with a predetermined technology and expressed as nets in a gate level netlist, the computer readable program in the computer readable medium comprising:

first computer readable program code for causing the computer to input data representing a netlist of the chip and parameters of the predetermined technology;

second computer readable program code for causing the computer to calculate an average wire length for each net based on the areas defined by the net;

third computer readable program code for causing the computer to assign each cell center to x,y coordinates to minimize the average wire length;

fourth computer readable program code for causing the computer to estimate widths of routing channels between consecutive columns and associated core sizes based on the assigned cell coordinates and the parameters of the predetermined technology; and fifth computer readable program code for causing the computer to identifying the minimum estimated core size.

11. The computer usable medium of claim 10, wherein the netlist includes definitions of the area of clock buffers and megacells, the medium further including:

sixth computer readable program code responsive to the first and fifth computer readable program codes for causing the computer to adjust the estimated minimum core size for area required for clock buffers and megacells.

12. The computer usable medium of claim 11, wherein the sixth computer readable program code causes the computer to calculate $\sqrt{D_{min}^2+A_c+A_m}$, where $D_{min}$ is the minimum estimated core size $A_c$ is the area of the core required for clock buffers and $A_m$ is the area of the core required for megacells.

13. The computer usable medium of claim 10, wherein the second computer readable program code includes:
   computer readable program code for causing the computer to identify average sizes of half-perimeters defined by the nets, and
   computer readable program code for causing the computer to calculate an average normalized wire length for the wires of the nets based on the average net size and a size of a half-perimeter of the core.

14. The computer usable medium of claim 10, wherein the third computer readable program code includes:
   seventh computer readable program code for causing the computer to assign a center of each cell to initial coordinates, $x_0,y_0$,
   eighth computer readable program code for causing the computer to calculate the center of each net,
   ninth computer readable program code for causing the computer to calculate new x,y coordinates for each cell center based on the initial $x_0,y_0$ coordinates for the cell and the x,y coordinates and numbers of pins of each net connected to the respective cell, and
   tenth computer readable program code for causing the computer to spread the cell placement over the x and y extents of the net.

15. The computer usable medium of claim 14, wherein the third computer readable program code further includes:
   eleventh computer readable program code for causing the computer to repeat execution of the ninth computer readable program code a first predetermined number of times, using the x,y coordinates calculated by the ninth computer readable code during the next prior iteration in place of the initial x,y coordinates,
   twelfth computer readable program code for causing the computer to calculate a new wire length for each net based on the placement of the cells, and
   thirteenth computer readable program code for causing the computer to repeat execution of the eleventh, tenth and twelfth computer readable codes a second predetermined number of times.

16. The computer usable medium of claim 10, wherein the fourth computer readable program code includes:
   computer readable program code for causing the computer to calculate the average wire length for the nets along the x and y directions, and
   computer readable program code for causing the computer to calculate minimum core sizes based on actual column utilization, x-direction routing utilization and y-direction routing utilization that do not exceed a maximum column utilization parameter, maximum x-direction routing utilization parameter and y-direction routing utilization parameter of the predetermined technology.

17. Apparatus for estimating a minimum core size of an integrated circuit chip composed of a plurality of cells to be fabricated using a predetermined technology and expressed as nets in a gate level netlist, comprising:
   input means for identifying a netlist of the chip and parameters of the predetermined technology;
   calculating means for calculating an average wire length for each net;
   assigning means responsive to the calculating means for assigning each cell center to x,y coordinates to minimize the average wire length;
   estimating means responsive to the input means and the assigning means for estimating widths of routing channels between consecutive columns and associated core sizes; and
   identifying means responsive to the estimating means for identifying the minimum core size.

18. The apparatus of claim 17, wherein the netlist includes definitions of the area of clock buffers and megacells, the apparatus further including:
   adjusting means for adjusting the identified minimum core size for area required for clock buffers and megacells.

19. The apparatus of claim 17, wherein the assigning means includes:
   assignment means for assigning initial x,y coordinates to the center of each cell,
   second calculating means responsive to the assignment means for calculating the coordinates of the center of each net,
   third calculating means responsive to the second calculating means for calculating new coordinates for each cell center based on the initial x,y coordinates for the cell and the x,y coordinates and numbers of pins of each net connected to the cell, and
   spreading means responsive to the third calculating means for spreading the placement of the cells over the x and y extents of the net.

20. The apparatus of claim 19, wherein the assigning means further includes:
   first iteration means for iteratively operating the second and third calculating means a first predetermined number of times using the new x,y coordinates calculated during the prior iteration by the third calculating means for the initial x,y coordinates,
   fourth calculation means responsive to the spreading means for calculating a new wire length for each net, and
   second iteration means for iteratively operating the first iterating means, the spreading means and the fourth calculating means a second predetermined number of times.

* * * * *